United States Patent
Calafiore et al.

(10) Patent No.: US 10,534,115 B1
(45) Date of Patent: Jan. 14, 2020

(54) GRAY-TONE ELECTRON-BEAM LITHOGRAPHY

(71) Applicant: Facebook Technologies, LLC, Menlo Park, CA (US)

(72) Inventors: Giuseppe Calafiore, Redmond, WA (US); Matthew E Colburn, Woodinville, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 17 days.

(21) Appl. No.: 15/713,419

(22) Filed: Sep. 22, 2017

(51) Int. Cl.
| | | |
|---|---|---|
| *H01J 37/30* | (2006.01) | |
| *G02B 5/18* | (2006.01) | |
| *F21V 8/00* | (2006.01) | |
| *H01J 37/20* | (2006.01) | |
| *G02B 27/01* | (2006.01) | |
| *H01J 37/317* | (2006.01) | |
| *H01J 37/302* | (2006.01) | |

(52) U.S. Cl.
CPC ......... *G02B 5/1857* (2013.01); *G02B 5/1866* (2013.01); *G02B 6/0035* (2013.01); *G02B 27/0172* (2013.01); *H01J 37/20* (2013.01); *H01J 37/3023* (2013.01); *H01J 37/3174* (2013.01); *G02B 2027/0125* (2013.01); *H01J 2237/30472* (2013.01); *H01J 2237/31766* (2013.01)

(58) Field of Classification Search
CPC .... H01J 37/3174; H01J 37/3023; H01J 37/20; H01J 2237/30472; H01J 2237/3175; H01J 2237/31766; G02B 5/1857; G02B 5/1866
See application file for complete search history.

(56) References Cited

U.S. PATENT DOCUMENTS

| | | | | |
|---|---|---|---|---|
| 3,914,608 A | * | 10/1975 | Malmberg | .......... H01J 37/1475 250/311 |
| 4,163,155 A | * | 7/1979 | Alles | ...................... B82Y 10/00 250/492.3 |
| 5,876,902 A | | 3/1999 | Veneklasen et al. | |
| 6,720,565 B2 | * | 4/2004 | Innes | ..................... B82Y 10/00 250/492.22 |
| 6,812,471 B2 | * | 11/2004 | Popiolkowski | ....... H01J 37/317 250/492.1 |
| 7,176,471 B2 | * | 2/2007 | Ito | .......................... B82Y 10/00 250/492.22 |
| 7,663,124 B2 | * | 2/2010 | Kasono | ................... B82Y 10/00 250/396 R |
| 8,168,373 B2 | | 5/2012 | Shew | |
| 8,614,052 B2 | * | 12/2013 | Galler | ................... B82Y 10/00 430/296 |

(Continued)

OTHER PUBLICATIONS

Kristjánsson, Sigurgeir, et al. "Circular grating coupled DBR laser with integrated focusing outcoupler." IEEE Photonics Technology Letters 9.4 (1997): 416-418 (Year: 1997).*

(Continued)

*Primary Examiner* — Wyatt A Stoffa
(74) *Attorney, Agent, or Firm* — Kilpatrick Townsend & Stockton LLP

(57) ABSTRACT

A modulated beam moving stage device is used in electron-beam photolithography to create an optical device. The optical device can have varying pitch to increase angular selectivity to increase light entering an eyebox of a virtual-reality and/or an augmented-reality system.

20 Claims, 8 Drawing Sheets

(56) References Cited

U.S. PATENT DOCUMENTS

| | | | |
|---|---|---|---|
| 8,975,601 B1 | 3/2015 | Chen | |
| 9,378,926 B2 | 6/2016 | Kuo et al. | |
| 9,690,208 B2 | 6/2017 | Yu | |
| 2001/0028039 A1* | 10/2001 | Plontke | H01J 37/3045 250/427 |
| 2002/0146627 A1* | 10/2002 | Suleski | G02B 3/0012 430/5 |
| 2003/0007444 A1* | 1/2003 | Tsukuda | B82Y 10/00 369/101 |
| 2003/0077039 A1* | 4/2003 | Kurihara | G03F 1/34 385/37 |
| 2005/0035308 A1* | 2/2005 | Javer | B82Y 10/00 250/492.22 |
| 2005/0151284 A1* | 7/2005 | Soeno | B82Y 10/00 264/1.33 |
| 2006/0108542 A1* | 5/2006 | Ito | B82Y 10/00 250/491.1 |
| 2006/0110116 A1* | 5/2006 | Sakai | B82Y 20/00 385/129 |
| 2006/0115745 A1* | 6/2006 | Yasuda | B82Y 10/00 430/5 |
| 2006/0121396 A1* | 6/2006 | Gauglitz | B82Y 10/00 430/396 |
| 2006/0124869 A1* | 6/2006 | Yoneyama | H01J 37/3023 250/492.23 |
| 2007/0160336 A1* | 7/2007 | Sakai | B82Y 20/00 385/129 |
| 2008/0026258 A1* | 1/2008 | Okino | B82Y 10/00 428/836 |
| 2008/0094694 A1* | 4/2008 | Yun | G02B 3/08 359/355 |
| 2008/0197295 A1* | 8/2008 | Kaule | B82Y 10/00 250/492.3 |
| 2008/0237460 A1* | 10/2008 | Fragner | B82Y 10/00 250/307 |
| 2009/0123870 A1* | 5/2009 | Usa | B82Y 10/00 430/296 |
| 2009/0134340 A1* | 5/2009 | Furuhashi | H01J 37/20 250/398 |
| 2009/0166553 A1* | 7/2009 | Okino | B82Y 10/00 250/396 R |
| 2009/0230328 A1* | 9/2009 | Komatsu | B82Y 10/00 250/492.3 |
| 2010/0237262 A1* | 9/2010 | Usa | B82Y 10/00 250/492.3 |
| 2011/0255388 A1* | 10/2011 | Goshima | B82Y 10/00 369/53.38 |
| 2013/0027683 A1* | 1/2013 | Yamashita | B82Y 10/00 355/67 |
| 2013/0058370 A1 | 3/2013 | Chang-Hasnain et al. | |
| 2014/0252228 A1* | 9/2014 | McMorran | G21K 1/06 250/311 |
| 2015/0344353 A1* | 12/2015 | Han | C03C 4/0071 385/14 |
| 2017/0243718 A1* | 8/2017 | Motosugi | H01J 37/3023 |
| 2018/0059297 A1* | 3/2018 | Peroz | G02B 6/0035 |
| 2018/0059304 A1* | 3/2018 | Bhargava | G02B 6/0035 |
| 2018/0095201 A1* | 4/2018 | Melli | G02B 6/124 |

OTHER PUBLICATIONS

Steingrüber, R., Möhrle, M., Sigmund, A., & Fürst, W. (2002). Continuously chirped gratings for DFB-lasers fabricated by direct write electron-beam lithography. Microelectronic engineering, 61, 331-335. (Year: 2002).*

"Blazed grating", retrieved from https://en.wikipedia.org/wiki/Blazed_grating, Dec. 26, 2016 and printed on Oct. 29, 2018.

"Electron-beam lithography", retrieved from https://en.wikipedia.org/wiki/Electron-beam_lithography, Sep. 12, 2017 and printed on Feb. 10, 2017.

"Grayscale Lithography", retrieved from http://www.eng.auburn.edu/~sylee/gray.html, Sep. 30, 2017 and printed on Oct. 29, 2018.

"Optical Components", retrieved from https://microdevices.jpl.nasa.gov/capabilities/optical-components/process-for-3-d-surface-relief-profiles.php and printed on Feb. 10, 2017.

"Stitch-free Lithography", retrieved from https://www.raith.com/technology/stitch-free-lithography.html, 2017 printed on Feb. 10, 2017.

Kirchner, et al., "ZEP520A—A resist for electron-beam grayscale lithography and thermal reflow", Microelectronic Engineering, vol. 153, Mar. 5, 2016, 3 pages.

NIST, "New Grayscale Technique Opens a Third Dimension for Nanoscale Lithography", retrieved from https://www.nist.gov/news-events/news/2013/08/new-grayscale-technique-opens-third-dimension-nanoscale-lithography, Aug. 28, 2013 and printed on Feb. 10, 2017.

Yu, et al., "The evaluation of photo/e-beam complementary grayscale lithography for high topography 3D structure", Proc. SPIE 8682, Advances in Resist Materials and Processing Technology XXX, 868212, retrieved from at: http://proceedings.spiedigitallibrary.org/proceeding.aspx?articleid=1674320, Mar. 29, 2013 and printed on Feb. 10, 2017.

Blazed grating, From Wikipedia, the free encyclopedia, last edited on Dec. 26, 2016, 3 pages. Available Online at: https://en.wikipedia.org/wiki/Blazed_grating.

Electron-beam lithography, From Wikipedia, the free encyclopedia, last edited on Sep. 12, 2017, 7 pages. Available Online at: https://en.wikipedia.org/wiki/Electron-beam_lithography.

Grayscale Lithography, Available Online at: http://www.eng.auburn.edu/~sylee/gray.html, 1 page.

NIST, New Grayscale Technique Opens a Third Dimension for Nanoscale Lithography, Available Online at: https://www.nist.gov/news-events/news/2013/08/new-grayscale-technique-opens-third-dimension-nanoscale-lithography, Aug. 28, 2013, 3 pages.

Optical Components, Available Online at: https://microdevices.jpl.nasa.gov/capabilities/optical-components/process-for-3-d-surface-relief-profiles.php, 6 pages.

Stitch-free Lithography, Available Online at: https://www.raith.com/technology/stitch-free-lithography.html, 2017, 1 page.

Kirchner et al., ZEP520A—A resist for electron-beam grayscale lithography and thermal reflow, Microelectronic Engineering, vol. 153, Mar. 5, 2016, pp. 71-76.

Yu et al., The evaluation of photo/e-beam complementary grayscale lithography for high topography 3D structure, Proc. SPIE 8682, Advances in Resist Materials and Processing Technology XXX, 868212, Available Online at: http://proceedings.spiedigitallibrary.org/proceeding.aspx?articleid=1674320, Mar. 29, 2013, 3 pages.

* cited by examiner

GRAY-TONE ELECTRON-BEAM LITHOGRAPHY

BACKGROUND

The disclosure relates generally to near-eye-display systems, and more specifically to waveguide displays with a small form factor, a large field of view, and/or a large eyebox. Near-eye, light-field displays project images directly into a user's eye, encompassing both near-eye displays and electronic viewfinders. Conventional near-eye displays generally have a display element that generates image light that passes through one or more lenses before reaching a user's eyes. Additionally, near-eye displays in virtual-reality (VR) systems and/or augmented-reality (AR) systems have design criteria to be compact, be light weight, and provide two-dimensional expansion with a large eyebox and a wide field-of-view (FOV). In typical near-eye displays, a limit for the FOV is based on satisfying two physical conditions: (1) an occurrence of total internal reflection of image light coupled into a waveguide, and (2) an existence of a first-order diffraction caused by a diffraction grating. Conventional methods used to satisfy the above two physical conditions rely on heavy and expensive components. Further, designing a conventional near-eye display with two-dimensional expansion involving two different output grating elements that are spatially separated often results in a large form factor. Accordingly, it is challenging to design near-eye displays using conventional methods to achieve a small form factor, a large FOV, and/or a large eyebox.

SUMMARY

The present disclosure relates generally to electron-beam (e-beam) lithography to create an optical device. More specifically, and without limitation, this disclosure relates to using three-dimensional e-beam lithography to form an output grating of a decoupling element for a near-eye display. In some embodiments, the output grating has variable linewidth for angular selectivity.

In some embodiments, a method of fabricating an optical device using electron-beam lithography comprises receiving instructions for varying a characteristic of a beam of electrons as a function of displacement of a substrate in relation to the beam of electrons, wherein the function is a monotonic function; generating the beam of electrons using an electron source; securing a substrate to a platform; controlling the platform to move in relation to the electron source; and/or varying the characteristic of the beam of electrons according to the function of displacement of the substrate in relation to the beam of electrons. In some embodiments the method further comprises repeating the instructions to expose a photoresist on the substrate to define an array of elements in the photoresist. In some embodiments the characteristic of the beam of electrons comprises a dwell time of the beam of electrons, which changes a dose of electrons exposing a photoresist on the substrate; the characteristic of the beam of electrons is a sequence of start times and stop times of the beam of electrons and/or the sequence speeds up or slows down in relation to movement of the platform; durations of intervals between start times and/or stop times of the sequence change while the platform maintains constant velocity; start times and/or stop times of the sequence have consistent intervals while the platform changes velocity; the function modifies the beam of electrons to expose one or more portions of a photoresist on the substrate and/or the method further comprises etching the substrate and/or the photoresist to form one or more elements in the substrate based on the one or more portions of the photoresist that are exposed; the one or more elements include a gray-tone element repeated in two-dimensions; the one or more elements include circles with varying diameters; the one or more elements include grating ridges of varying heights; and/or the optical device is a grating and/or the grating is a chirped grating.

In some embodiments, a system used in electron-beam lithography comprises an electron source, wherein the electron source produces a beam of electrons; a platform configured to: hold a substrate and/or move in relation to the electron source; and/or a controller configured to: control movement of the platform in relation to the electron source and/or vary a characteristic of the beam of electrons as a function of substrate displacement in relation to the beam of electrons, wherein the function is a monotonic function. In some embodiments, the characteristic of the beam of electrons is an intensity of the beam of electrons; the system further comprises a photoresist covering at least a portion of a surface of the substrate; the beam of electrons forms an element in the photoresist by exposing the photoresist; a writing field of the beam of electrons on the platform is defined by an area of the platform that can be exposed by the beam of electrons without field stitching and/or the writing field is equal to or greater than 0.36 square millimeters and equal to or less than 3600 square millimeters; movement of the platform in relation to the electron source is along only one axis of a three-dimensional coordinate system; movement of the platform in relation to the electron source is along two dimensions of a three-dimensional coordinate system; the characteristic of the beam of electrons comprises a width of the beam of electrons; the platform is configured to move in a first direction, the electron source is configured to move the beam of electrons in a second direction, and/or the characteristic of the beam of electrons is varied start times and/or stop times of the beam of electrons.

In some embodiments, a system used for a virtual-reality and/or an augmented-realty display comprises an optical source; a waveguide; a coupling element configured to couple light from the optical source into the waveguide; and/or a decoupling element configured to couple light out of the waveguide, wherein the decoupling element comprises a chirped grating.

BRIEF DESCRIPTION OF THE DRAWINGS

Illustrative embodiments are described with reference to the following figures.

Figure 1:
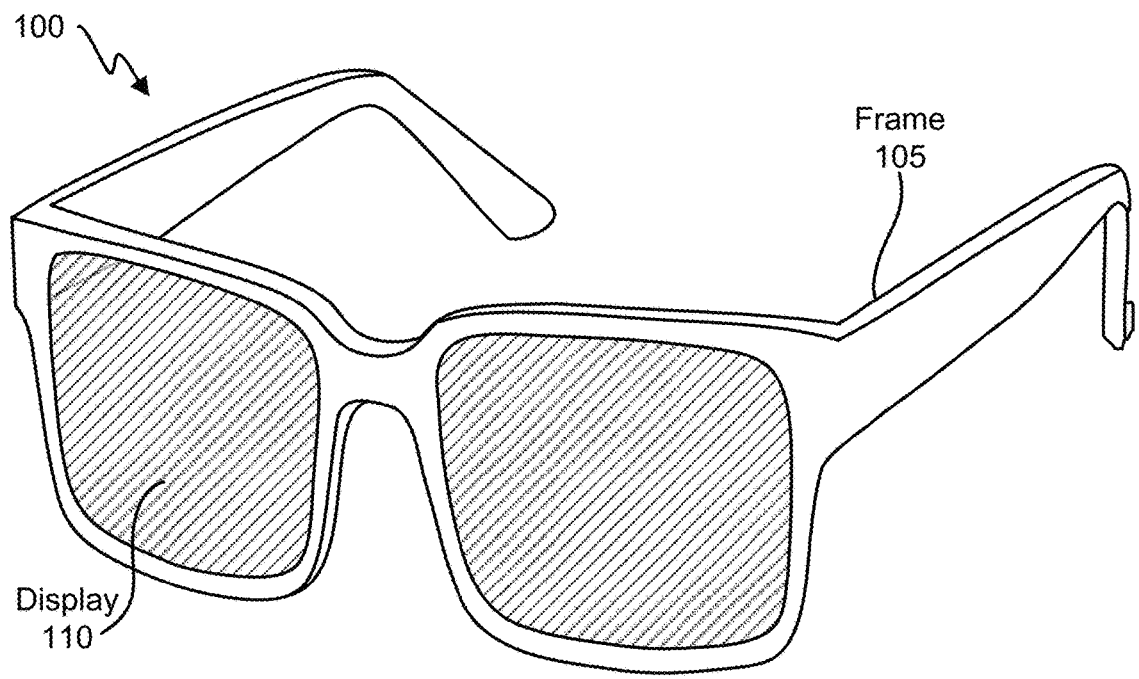
FIG. 1 is a diagram of an embodiment of a near-eye display.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

This disclosure relates generally to electron-beam (e-beam) lithography to create an optical device. More specifically, and without limitation, this disclosure relates to using three-dimensional e-beam lithography to form an output grating of a decoupling element for a near-eye display. In some embodiments, the output grating is a chirped grating so that the output grating has angular selectivity. By using angular selectivity, light intensity is manipulated (e.g., increase and/or decrease) from the decoupling element into the eyebox of the near-eye display.

Standard e-beam systems that use a Gaussian beam to expose photoresist have a writing field up to 500-by-500 μm. The e-beam system is steered to write in a writing field. A larger area can be written in by tiling individual writing fields. "Stitching" at the edge of a writing field (inaccuracy in tiling) is a problem for some optical applications. Stitching in e-beam lithography systems is usually specified as sub-20 nm, which does not produce a high quality lithography pattern for AR (augmented reality) and/or VR systems.

An electron beam can be steered while moving a stage holding a substrate. This enables writing of continuous patterns that can be much larger than the standard 500-by-500 μm field. The effect is a stitching-free pattern at least in one direction (e.g., in an x-direction). A full area can be obtained by stitching stripes of patterns. In some embodiments, a Modulated Beam Moving Stage (MBMS) device is used to fabricate an optical device using e-beam photolithography. A photoresist is applied to a substrate. An electron source generates an electron beam. The electron beam forms a three-dimensional pattern by exposing the photoresist as the substrate is moved in relation to the electron beam. The pattern comprises a plurality of elements. The pattern in the photoresist is transferred to the substrate by etching. For example, places on the substrate with thicker photoresist are etched less than places on the substrate with less photoresist. In some uses of MBMS technology, an MBMS device physically moves a stage relative to a beam of electrons according to a fixed, periodic function (e.g., sinusoid).

In some embodiments, one or more parameters of the e-beam is varied according to a location-dependent function, beyond a mere periodic function. Such a technique allows "gray toning" in e-beam lithography. That is, characteristics such as linewidth, pitch, dose, etc., of elements can be varied across a portion of the substrate, e.g., across a particular element and/or across a travel range of the moving stage.

Though conventional MBMS devices can write seamlessly on a large writing area (e.g., 30 mm×30 mm), they are limited to elements with binary heights and repeating elements (e.g., a binary grating having grooves of uniform depth and uniform pitch). Conventional e-beam lithography (not MBMS) is limited to a small writing area (e.g., less than 500 μm×500 μm using beam deflection), but can write in grayscale (e.g., defining elements with varying vertical profiles). The present disclosure covers using an MBMS device to create three-dimensional elements (e.g., varying heights) and/or varying elements (e.g., different sized holes and/or gratings with varying pitch) on large writing areas FIG. 1 is a diagram of an embodiment of a near-eye display 100. The near-eye display 100 presents media to a user. Examples of media presented by the near-eye display 100 include one or more images, video, and/or audio. In some embodiments, audio is presented via an external device (e.g., speakers and/or headphones) that receives audio information from the near-eye display 100, a console, or both, and presents audio data based on the audio information. The near-eye display 100 is generally configured to operate as a virtual reality (VR) display. In some embodiments, the near-eye display 100 is modified to operate as an augmented reality (AR) display and/or a mixed reality (MR) display.

The near-eye display 100 includes a frame 105 and a display 110. The frame 105 is coupled to one or more optical elements. The display 110 is configured for the user to see content presented by the near-eye display 100. In some embodiments, the display 110 comprises a waveguide display assembly for directing light from one or more images to an eye of the user.

Figure 2:
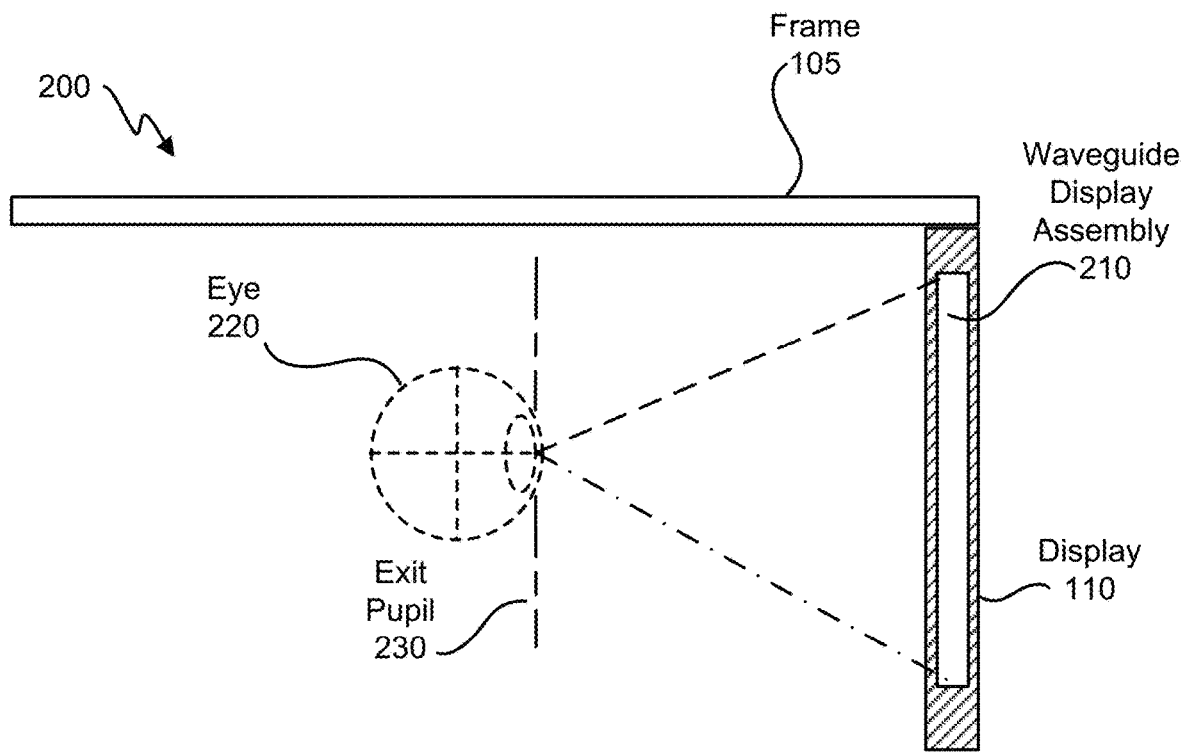
FIG. 2 is an embodiment of a cross section of the near-eye display.

FIG. 2 is an embodiment of a cross section 200 of the near-eye display 100 illustrated in FIG. 1. The display 110 includes at least one waveguide display assembly 210. An exit pupil 230 is a location where the eye 220 is positioned in an eyebox region when the user wears the near-eye display 100. For purposes of illustration, FIG. 2 shows the cross section 200 associated with a single eye 220 and a single waveguide display assembly 210, but a second waveguide display is used for a second eye of a user.

The waveguide display assembly 210 is configured to direct image light to an eyebox located at the exit pupil 230 and to the eye 220. The waveguide display assembly 210 may be composed of one or more materials (e.g., plastic, glass, etc.) with one or more refractive indices. In some embodiments, the near-eye display 100 includes one or more optical elements between the waveguide display assembly 210 and the eye 220.

In some embodiments, the waveguide display assembly 210 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display is also a polychromatic display that can be projected on multiple planes (e.g. multi-planar colored display). In some configurations, the stacked waveguide display is a monochromatic display that can be projected on multiple planes (e.g. multi-planar monochromatic display). The varifocal waveguide display is a display that can adjust a focal position of image light emitted from the waveguide display. In alternate embodiments, the waveguide display assembly 210 may include the stacked waveguide display and the varifocal waveguide display.

Figure 3:
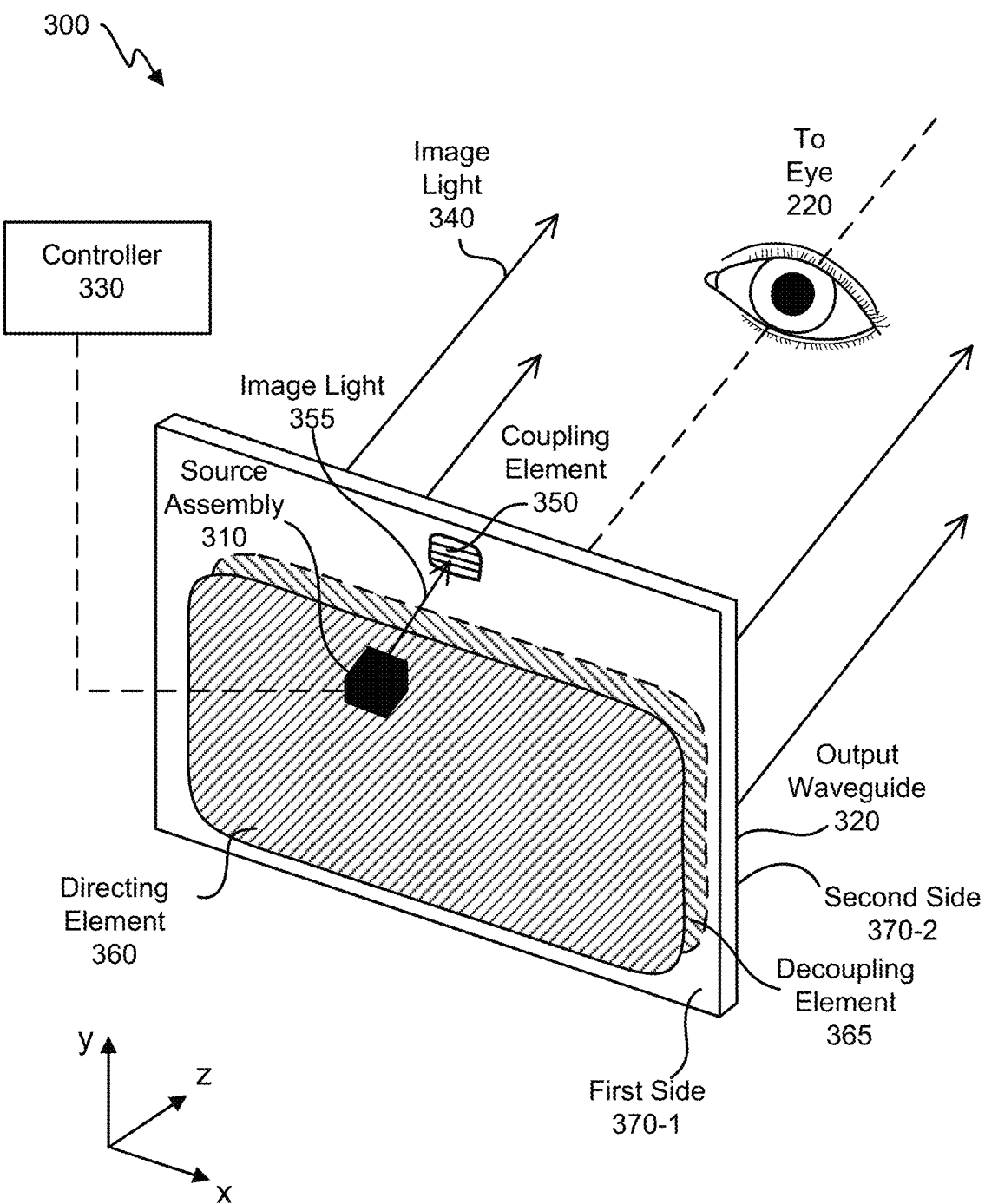
FIG. 3 illustrates an isometric view of an embodiment of a waveguide display with a single source assembly.

FIG. 3 illustrates an isometric view of an embodiment of a waveguide display 300. In some embodiments, the waveguide display 300 is a component (e.g., the waveguide display assembly 210) of the near-eye display 100. In some embodiments, the waveguide display 300 is part of some other near-eye display or other system that directs image light to a particular location.

The waveguide display 300 includes a source assembly 310, an output waveguide 320, and a controller 330. For purposes of illustration, FIG. 3 shows the waveguide display 300 associated with a single eye 220, but in some embodiments, another waveguide display separate, or partially separate, from the waveguide display 300 provides image light to another eye of the user.

The source assembly 310 generates image light 355. The source assembly 310 generates and outputs the image light 355 to a coupling element 350 located on a first side 370-1 of the output waveguide 320. The output waveguide 320 is an optical waveguide that outputs expanded image light 340 to an eye 220 of a user. The output waveguide 320 receives the image light 355 at one or more coupling elements 350 located on the first side 370-1 and guides received input image light 355 to a directing element 360. In some embodiments, the coupling element 350 couples the image light 355 from the source assembly 310 into the output waveguide 320. The coupling element 350 may be, e.g., a diffraction grating, a holographic grating, one or more cascaded reflectors, one or more prismatic surface elements, and/or an array of holographic reflectors.

The directing element 360 redirects the received input image light 355 to the decoupling element 365 such that the received input image light 355 is decoupled out of the output waveguide 320 via the decoupling element 365. The directing element 360 is part of, or affixed to, the first side 370-1 of the output waveguide 320. The decoupling element 365 is part of, or affixed to, the second side 370-2 of the output waveguide 320, such that the directing element 360 is opposed to the decoupling element 365. The directing element 360 and/or the decoupling element 365 may be, e.g., a diffraction grating, a holographic grating, one or more cascaded reflectors, one or more prismatic surface elements, and/or an array of holographic reflectors.

The second side 370-2 represents a plane along an x-dimension and a y-dimension. The output waveguide 320 may be composed of one or more materials that facilitate total internal reflection of the image light 355. The output waveguide 320 may be composed of e.g., silicon, plastic, glass, and/or polymers. The output waveguide 320 has a relatively small form factor. For example, the output waveguide 320 may be approximately 50 mm wide along x-dimension, 30 mm long along y-dimension and 0.5-1 mm thick along a z-dimension.

The controller 330 controls scanning operations of the source assembly 310. The controller 330 determines scanning instructions for the source assembly 310. In some embodiments, the output waveguide 320 outputs expanded image light 340 to the user's eye 220 with a large field of view (FOV). For example, the expanded image light 340 provided to the user's eye 220 with a diagonal FOV (in x and y) of 60 degrees and or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Figure 4:
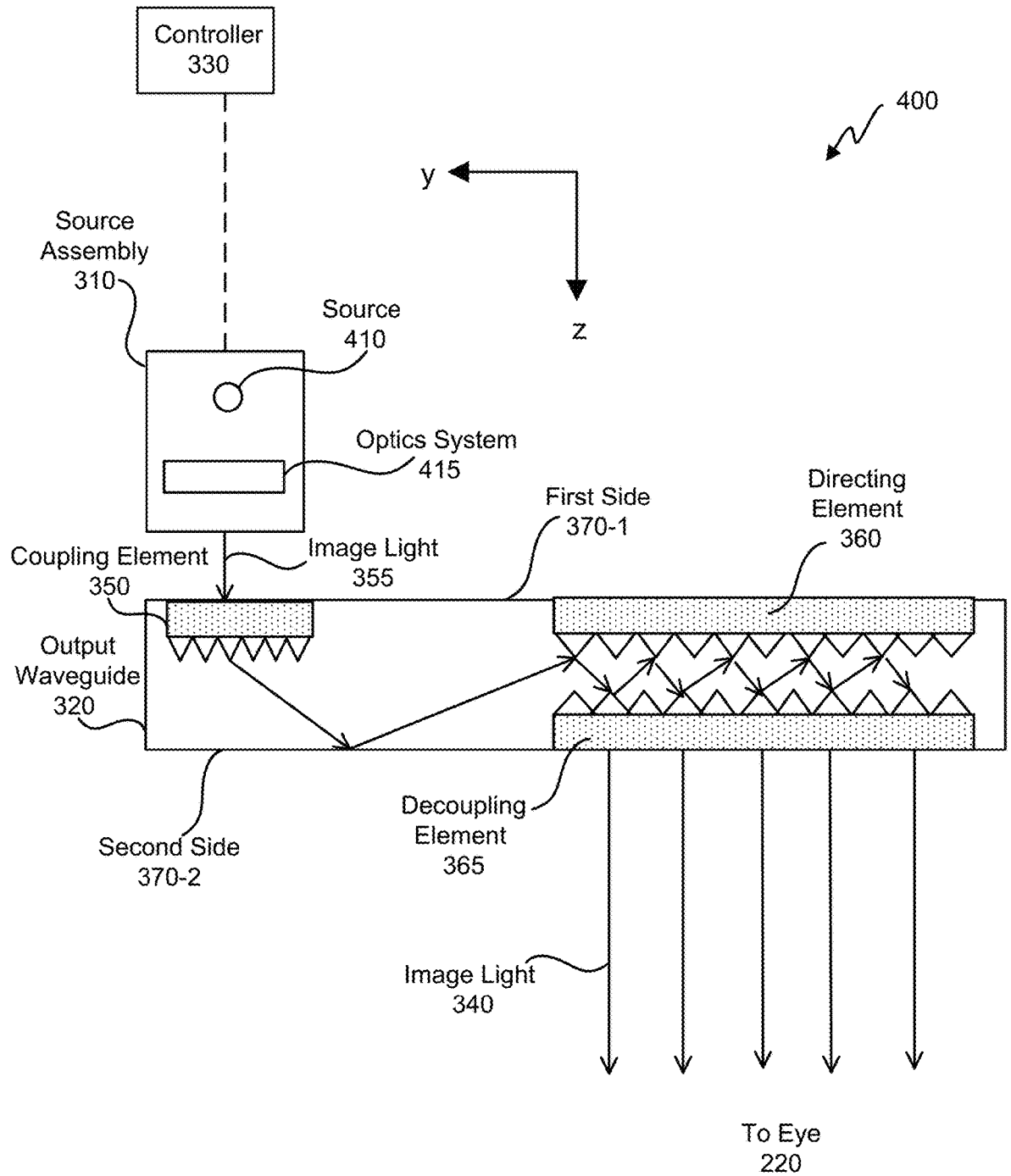
FIG. 4 illustrates a cross section of an embodiment of the waveguide display.

FIG. 4 illustrates an embodiment of a cross section 400 of the waveguide display 300. The cross section 400 includes the source assembly 310 and the output waveguide 320. The source assembly 310 generates image light 355 in accordance with scanning instructions from the controller 330. The source assembly 310 includes a source 410 and an optics system 415. The source 410 is a light source that generates coherent or partially coherent light. The source 410 may be, e.g., a laser diode, a vertical cavity surface emitting laser, and/or a light emitting diode.

The optics system 415 includes one or more optical components that condition the light from the source 410. Conditioning light from the source 410 may include, e.g., expanding, collimating, and/or adjusting orientation in accordance with instructions from the controller 330. The one or more optical components may include one or more lens, liquid lens, mirror, aperture, and/or grating. In some embodiments, the optics system 415 includes a liquid lens with a plurality of electrodes that allows scanning a beam of light with a threshold value of scanning angle to shift the beam of light to a region outside the liquid lens. Light emitted from the optics system 415 (and also the source assembly 310) is referred to as image light 355.

The output waveguide 320 receives the image light 355. The coupling element 350 couples the image light 355 from the source assembly 310 into the output waveguide 320. In embodiments where the coupling element 350 is diffraction grating, a pitch of the diffraction grating is chosen such that total internal reflection occurs in the output waveguide 320, and the image light 355 propagates internally in the output waveguide 320 (e.g., by total internal reflection), toward the decoupling element 365.

The directing element 360 redirects the image light 355 toward the decoupling element 365 for decoupling from the output waveguide 320. In embodiments where the directing element 360 is a diffraction grating, the pitch of the diffraction grating is chosen to cause incident image light 355 to exit the output waveguide 320 at angle(s) of inclination relative to a surface of the decoupling element 365.

In some embodiments, the directing element 360 and/or the decoupling element 365 are structurally similar. The expanded image light 340 exiting the output waveguide 320 is expanded along one or more dimensions (e.g., may be elongated along x-dimension). In some embodiments, the waveguide display 300 includes a plurality of source assemblies 310 and a plurality of output waveguides 320. Each of the source assemblies 310 emits a monochromatic image light of a specific band of wavelength corresponding to a primary color (e.g., red, green, or blue). Each of the output waveguides 320 may be stacked together with a distance of separation to output an expanded image light 340 that is multi-colored.

Figure 5:
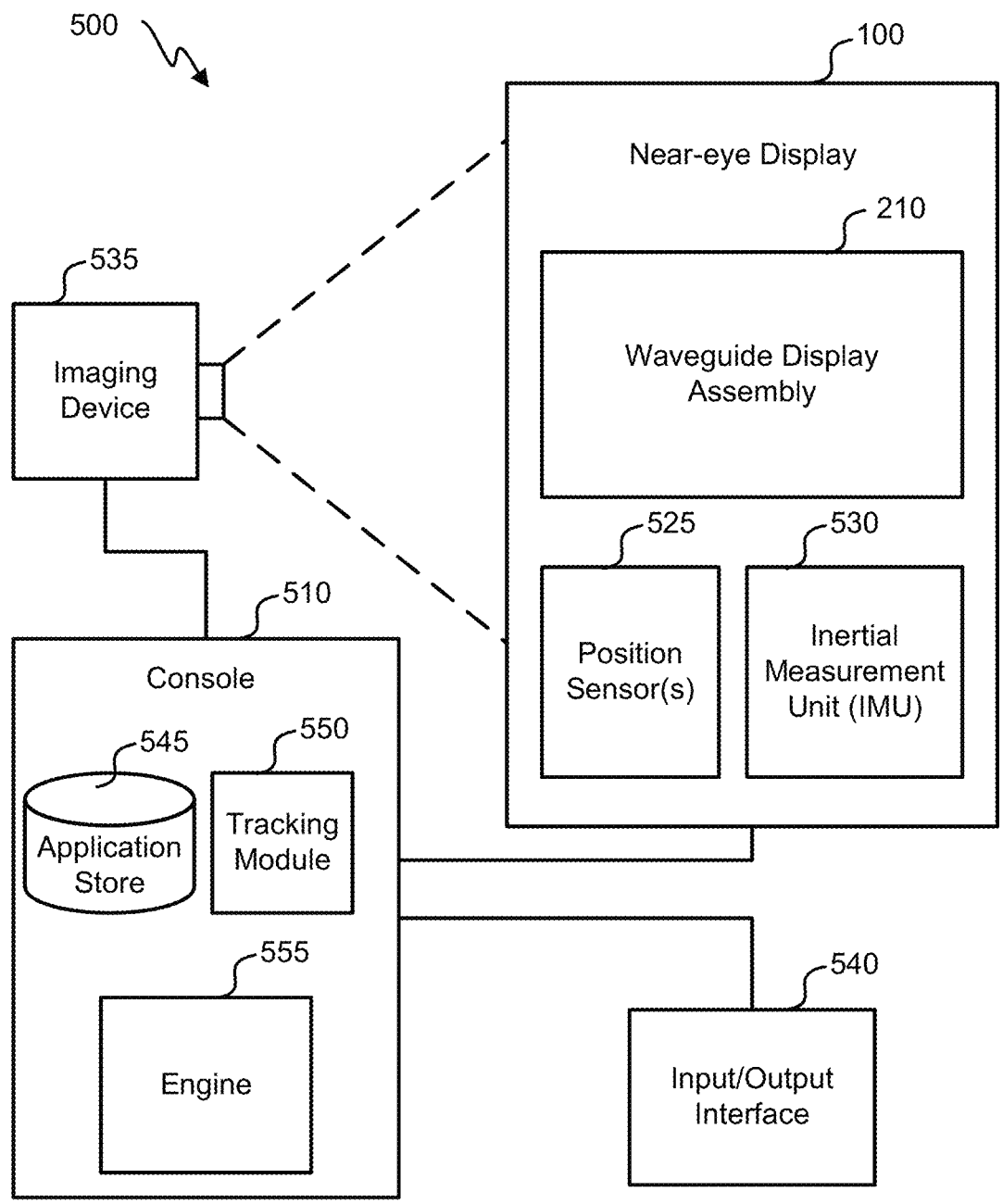
FIG. 5 is a block diagram of an embodiment of a system including the near-eye display.

FIG. 5 is a block diagram of an embodiment of a system 500 including the near-eye display 100. The system 500 comprises the near-eye display 100, an imaging device 535, and an input/output interface 540 that are each coupled to a console 510.

The near-eye display 100 is a display that presents media to a user. Examples of media presented by the near-eye display 100 include one or more images, video, and/or audio. In some embodiments, audio is presented via an external device (e.g., speakers and/or headphones) that receives audio information from the near-eye display 100 and/or the console 510 and presents audio data based on the audio information to a user. In some embodiments, the near-eye display 100 may also act as an AR eyewear glass. In some embodiments, the near-eye display 100 augments views of a physical, real-world environment, with computer-generated elements (e.g., images, video, sound, etc.).

The near-eye display 100 includes a waveguide display assembly 210, one or more position sensors 525, and/or an inertial measurement unit (IMU) 530. The waveguide display assembly 210 includes the source assembly 310, the output waveguide 320, and the controller 330.

The IMU 530 is an electronic device that generates fast calibration data indicating an estimated position of the near-eye display 100 relative to an initial position of the near-eye display 100 based on measurement signals received from one or more of the position sensors 525.

The imaging device 535 generates slow calibration data in accordance with calibration parameters received from the console 510. The imaging device 535 may include one or more cameras and/or one or more video cameras.

The input/output interface 540 is a device that allows a user to send action requests to the console 510. An action request is a request to perform a particular action. For example, an action request may be to start or end an application or to perform a particular action within the application.

The console 510 provides media to the near-eye display 100 for presentation to the user in accordance with information received from one or more of: the imaging device 535, the near-eye display 100, and the input/output interface 540. In the example shown in FIG. 5, the console 510 includes an application store 545, a tracking module 550, and an engine 555.

The application store 545 stores one or more applications for execution by the console 510. An application is a group of instructions, that when executed by a processor, generates content for presentation to the user. Examples of applications include: gaming applications, conferencing applications, video playback application, or other suitable applications.

The tracking module 550 calibrates the system 500 using one or more calibration parameters and may adjust one or more calibration parameters to reduce error in determination of the position of the near-eye display 100.

The tracking module 550 tracks movements of the near-eye display 100 using slow calibration information from the imaging device 535. The tracking module 550 also determines positions of a reference point of the near-eye display 100 using position information from the fast calibration information.

The engine 555 executes applications within the system 500 and receives position information, acceleration information, velocity information, and/or predicted future positions of the near-eye display 100 from the tracking module 550. In some embodiments, information received by the engine 555 may be used for producing a signal (e.g., display instructions) to the waveguide display assembly 210 that determines a type of content presented to the user.

Figure 6:
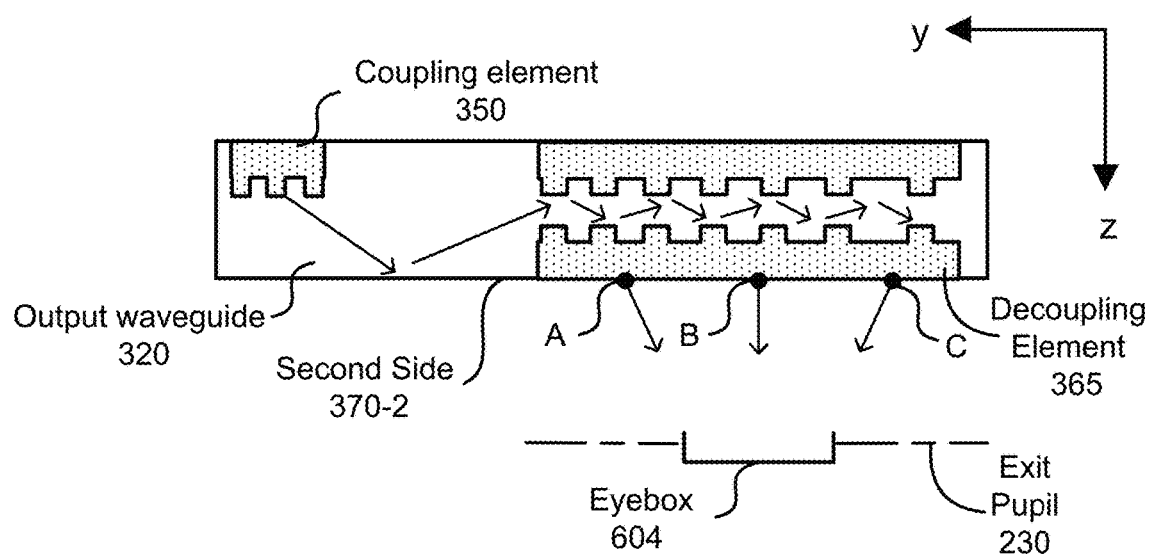
FIG. 6 illustrates a cross section an embodiment of a waveguide display with angular selectivity.

FIG. 6 illustrates a cross section 600 of an embodiment of a waveguide display with angular selectivity. Angular selectivity addresses system-level efficiency. Cross section 600 includes the coupling element 350, the output waveguide 320, the decoupling element 365, and an eyebox 604, wherein the eyebox 604 is at the exit pupil 230. Light traveling from the coupling element 350 is transmitted through the output waveguide 320 and to the decoupling element 365. Light from the decoupling element 365 is selectively directed to the eyebox 604. The eyebox 604 is a usable area of light output from the decoupling element 365 at the exit pupil 230. In some embodiments, direction of light from the decoupling element 365 is not changed. In some embodiments, an intensity within a particular angular field of view is optimized. Gratings project light over a range of in-coupled angles. Extraction efficiency is increased for a particular field of view that hits the eyebox 604, thus minimizing light that cannot be seen by the eye. For example, light intensity distribution between modes of a grating is changed as a function of x and/or y so that more light is directed in a mode of the grating that is within the field of view of the eyebox 604.

Point A, point B, and point C are points along a plane of the decoupling element 365 where light is transmitted from the decoupling element 365 toward the eyebox 604. Point A is opposite point C. Point B is between point A and point C. The decoupling element 365 is a diffraction grating. The diffraction grating is configured to selectively change distribution of light emitted in modes of the diffraction grating. In FIG. 6, light from point A is primarily distributed in a mode directed down and to the right; light from point B is primarily distributed in a mode directed down (i.e., in a direction normal to the second side 370-2 of the output waveguide 320); and light from point C is primarily distributed in a mode directed down and to the left. Put another way, light from points A, B, and C can be defined by two vectors, a vector normal to the second side 370-2 and a lateral vector, wherein the lateral vector is orthogonal to the normal vector. The lateral vector of light from point A points in a direction opposite the lateral vector of light from point C; and a lateral vector of light from point B is zero (e.g., light from point B is in a direction of the normal vector of the second side 370-2). Thus light emitted from the decoupling element 365 is selectively directed to the eyebox 604 from point A, point B, and point C.

If light from the decoupling element 365 was not angularly directed, light from point A and/or point C would be transmitted in a direction parallel to light transmitted form point B (e.g., as shown in FIG. 4), and not as much light would enter the eyebox 604. Thus light from point B would appear brighter than light from point A and from point C. Thus if an image of a tree were centered in a field of view, a middle of a trunk of a tree might look bright, and leaves at a top of the tree and ground near a base of the tee (e.g., parts of a periphery of the image) might appear faded to a user. Parts of the periphery might appear faded because light intensity from pixels of the display 110 in the periphery (e.g., from point A and/or point C) would have less intensity reaching the eyebox 604 than light intensity from point B. For example, light from a first-order mode of a diffraction grating from points A and C would transmit parallel to a z-dimension and not selectively directed into the eyebox 604. In some embodiments, a lens is used to focus light from point A and/or point C into the eyebox 604. Yet a lens can be heavy to a user. Thus not using a lens, or using a thinner lens, improves a user's experience because the VR set is not as heavy.

In some embodiments, the decoupling element 365 is designed such that light from points between point A, point B, and/or point C are also selectively directed to the eyebox 604 (e.g., a grating of the decoupling element 365 is designed with a varied pitch). In some embodiments, the grating is a two-sided grating with a fixed radius of curvature and/or each side of the grating is chirped and/or distinct. In some embodiments, the output waveguide 320 is curved and/or the grating is a chirped grating.

In some embodiments, a system used for a virtual-reality display comprises: an optical source (e.g., source assembly 310); a waveguide (e.g., output waveguide 320); a coupling element (e.g., coupling element 350) configured to couple light from the optical source into the waveguide; and/or a decoupling element (e.g., decoupling element 365) configured to couple light out of the waveguide, wherein the decoupling element comprises a chirped grating. The chirped grating is a grating with variable line spacing. The variable line spacing is configured to selectively direct light from the decoupling element 365 to the eyebox 604.

Figure 7:
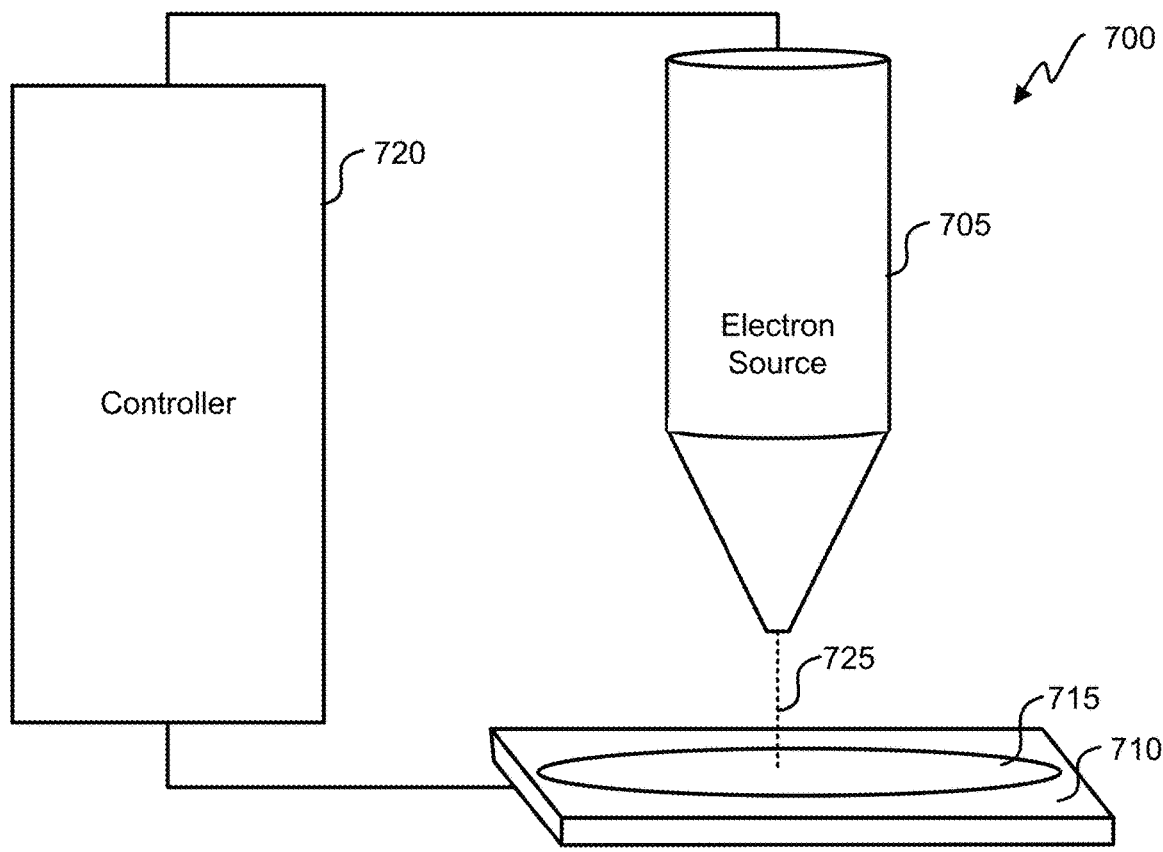
FIG. 7 is a block diagram of an embodiment of a system for electron-beam lithography.

FIG. 7 is a block diagram of an embodiment of a system 700 used in electron beam lithography. The system 700 comprises an electron source 705, a platform 710, a substrate 715, and a controller 720.

The electron source 705 produces a beam of electrons 725. The platform 710 is configured to hold the substrate 715, such that the substrate 715 does not move in relation to the platform 710. The platform 710 is movable in relation to electron source 705. The controller 720 is configured to move the platform 710 in relation to the electron source 705 and vary a characteristic of the beam of electrons 725 as a function of displacement of the substrate 715 in relation to the beam of electrons 725.

A photoresist covers at least a portion of the substrate 715. The beam of electrons 725 exposes the photoresist as the substrate 715 is moved in relation to the beam of electrons 725 to form a pattern in the photoresist. The pattern comprises one or more elements. The pattern is transferred to the substrate by etching. For example, the photoresist is a positive photoresist. The beam of electrons 725 exposes a pattern in the photoresist of multiple rectangular cuboids. A rectangular cuboid has a width w, a height h, and a length L. The photoresist is developed and exposed photoresist is removed. After the substrate is etched, the multiple rectangular cuboids of the exposed photoresist are transferred to the substrate 715 as grooves (e.g., for a grating). The grooves have depth equal to the height h, a width equal to the width w, and a length equal to the length L. The photoresist can be either a positive photoresist (exposed portion removed after applying developer) or a negative photoresist (exposed portion remains after applying developer).

In some embodiments, the characteristic of the beam of electrons 725 that is varied is an intensity of the beam of electrons 725; start times and/or stop times of the beam of electrons 725 in relation to each other (e.g., a duration of time between subsequent start times increases); a width and/or diameter of the beam of electrons 725; a dwell time of the beam of electrons 725 relative to the substrate 715 (e.g., the platform 710 stops moving while exposing the substrate 715 to the beam of electrons 725); variable dose; and/or a sequence of start times and stop times of the beam of electrons 725. In some embodiments, the sequence of start times and stop times speeds up or slows down in relation to movement of the platform 710. Variable dose is exposure of the photoresist that has more levels than binary (e.g., more dose levels than two: on and off; grayscale). In some embodiments, the function is a monotonic function. A monotonic function is a function that is either entirely non-increasing or non-decreasing.

An area of the substrate that can be exposed by the beam of electrons 725, without field stitching, is a writing field. In some embodiments, the writing field is equal to or greater than 0.36 square millimeters and equal to or less than 3600 square millimeters.

Figure 8:
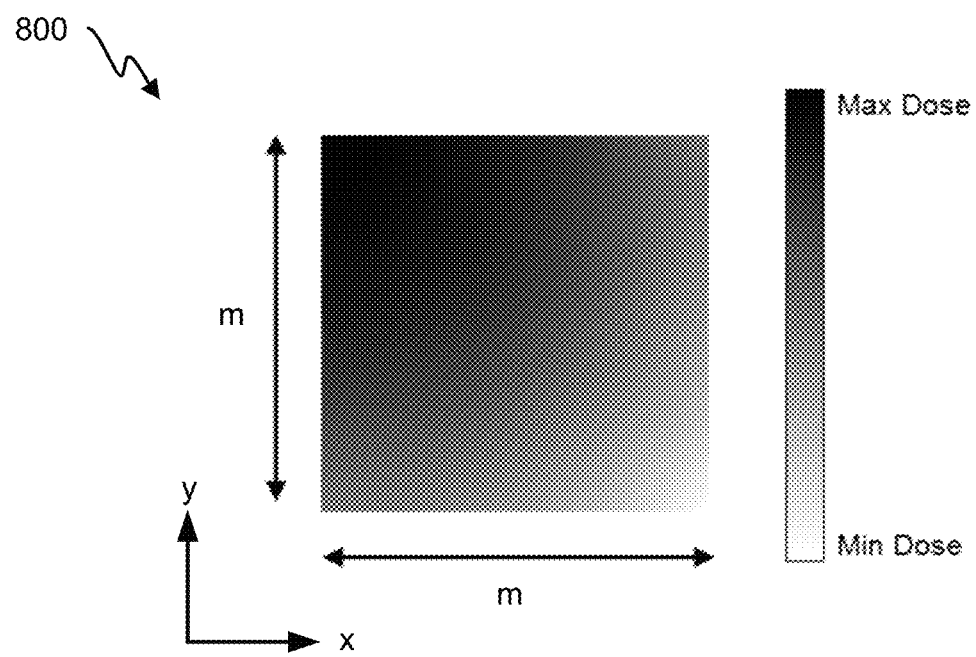
FIG. 8 depicts an embodiment of a map of a dose for exposure of a photoresist on a substrate.

FIG. 8 depicts an embodiment of a map 800 of a dose for exposure of a photoresist on the substrate 715. The map 800 of the dose for exposure defines the function of displacement of the substrate 715 in relation to the beam of electrons 725. A maximum dose ("Max Dose") of the beam of electrons 725 is shown as black; a minimum dose ("Min Dose") of the beam of electrons 725 is shown as white; and variations between the maximum dose and the minimum dose are shown in grayscale. The map 800 of the dose for exposure is square with sides of length m. In some embodiments, m=length of writing area, which is equal to or greater than 0.6 mm and equal to or less than 60 mm (e.g., m=10 mm, 20 mm, 30 mm, and/or 40 mm).

Figures 9, 10:
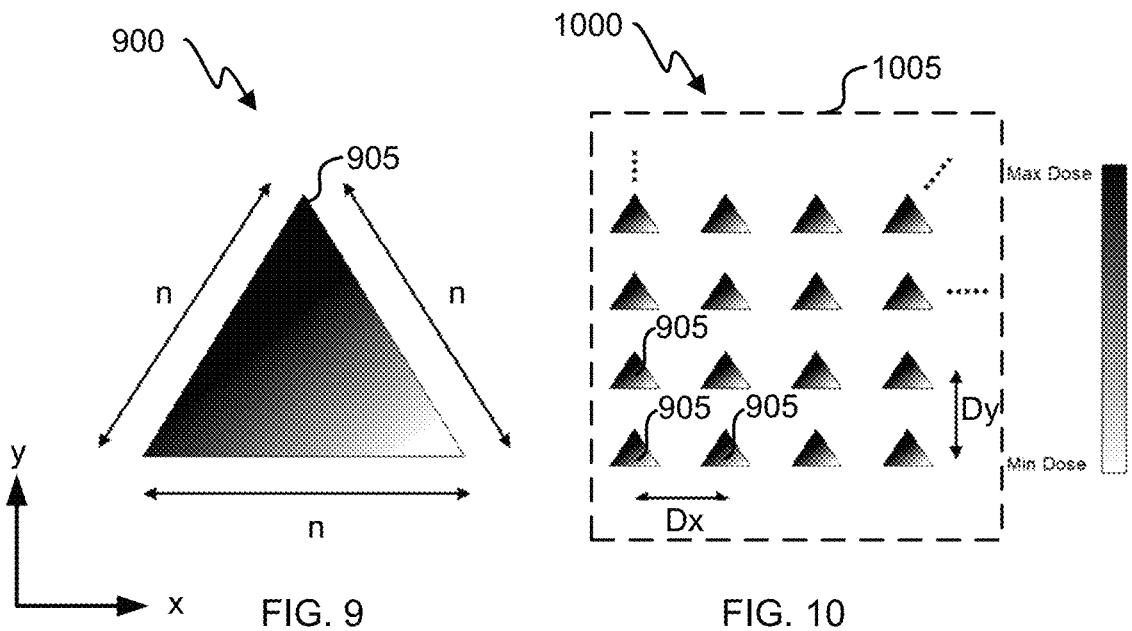
FIG. 9 depicts an embodiment of a map of a dose for exposure of a photoresist using an electron beam to define an element on a substrate.
FIG. 10 depicts an embodiment of a map of a dose for exposure of a photoresist using an electron beam to define an array of elements on a substrate.

FIG. 9 depicts an embodiment of a map 900 of a dose for exposing an element 905 of a pattern. The element is a triangular pillar or a triangular hole, with varying height. For example, if the photoresist is a positive photoresist, then the element will be a triangular hole with varying height; and if the photoresist is a negative resist, then the element will be a triangular pillar with varying height. The triangle is an equilateral triangle with each side having a length n. A height (e.g., in a direction out of the page) of the triangular pillar is varied according the map 900 of the dose for exposure. In some embodiments, the element 905 has a cross section in the x/y plane with a shape of a circle (e.g., to form holes with varying diameters and/or depths in the substrate 715), half circle, oval, triangle, square, rectangle, quadrilateral, pentagon, hexagon, polygon, chevron, and/or a mix of one or more of those shapes. In some embodiments, the element 905 is a ridge or a trench for a grating. Shapes are limited by writing capabilities of the system 700. In some embodiments, the length n is equal to or greater than 0.5 µm and equal to or less than 10 µm (e.g., 1, 2, 3, and/or 4 µm).

FIG. 10 depicts an embodiment of a map 1000 of a dose for exposure to define an array 1005 of elements 905 on the substrate 715. Elements 905 are repeated along an x-direction and along a y-direction to create the array 1005. Elements 905 are spaced a distance Dx from each other along the x-direction (e.g., as measured from center to center of elements 905) and spaced a distance Dy from each other along the y-direction. In some embodiments, Dx changes as a function of x and/or y and/or Dy changes as a function of x and/or y. Thus spacing between elements 905 can change. In some embodiments, sizes and/or shapes of elements 905 are varied in the array 1005. For example, length n of element 905 increases and/or decreases as a function of x and/or y; and/or elements 905 change shape, e.g., from triangles to circles or from grooves (e.g., of a grating) to circles.

Figure 11:
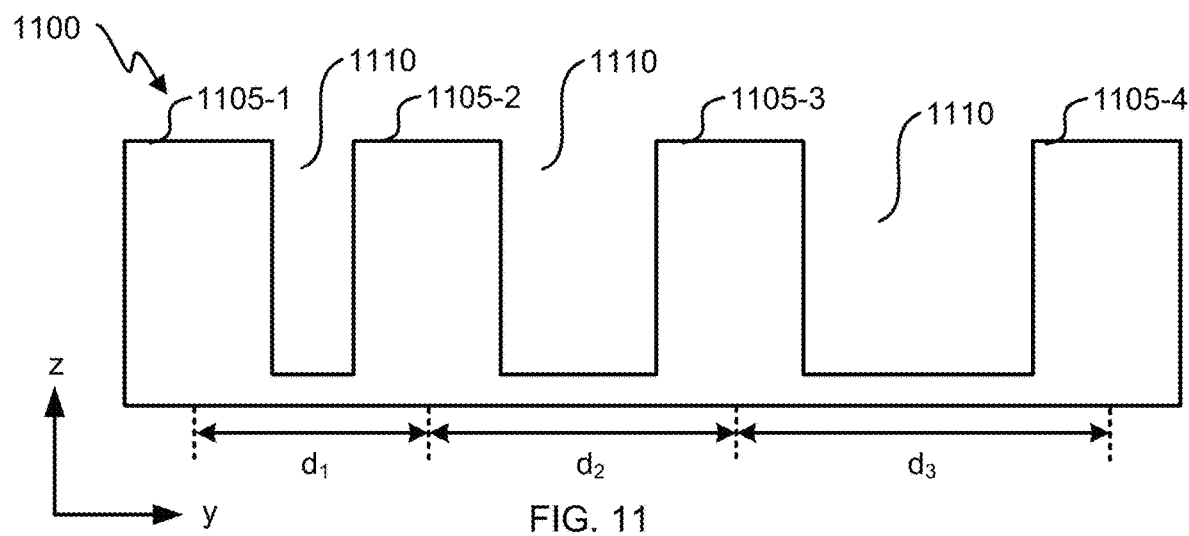
FIG. 11 depicts an embodiment of a cross section of a grating with varying pitch.

FIG. 11 depicts an embodiment of a cross section of a first grating 1100. The first grating 1100 is formed in the substrate 715 after developing the photoresist and etching the substrate 715. The first grating 1100 has varying pitch (e.g., varying as a function of x and/or y). The first grating 1100 has alternating ridges 1105 and grooves 1110, wherein sides of adjacent ridges 1105 define a groove 1110. Line spacing d is a distance from a ridge 1105 to an adjacent ridge, measured center to center. A first line spacing d1 defines a distance from a first ridge 1105-1 to a second ridge 1105-2; a second line spacing d2 defines a distance from the second ridge 1105-2 to a third ridge 1105-3; a third line spacing d3 defines a distance from the third ridge 1105-3 to a fourth ridge 1104-5; and d1<d2<d3. In some embodiments, line spacing d corresponds to pitch. Put another way, widths of grooves 1110 are varied as a function of x and/or y. In some embodiments, width of ridges 1105 is varied as a function of x and/or y.

Figure 12:
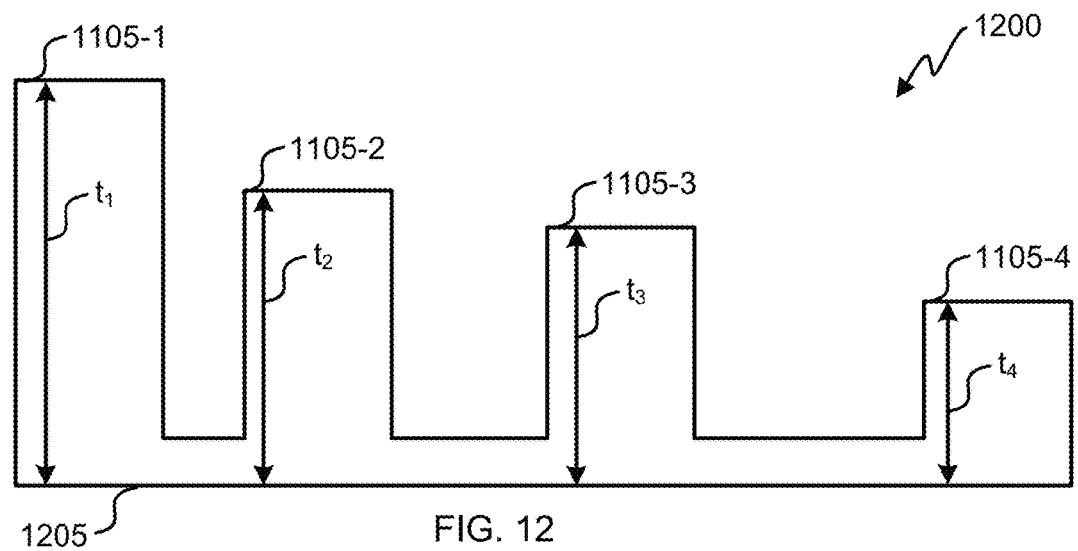
FIG. 12 depicts an embodiment of a cross section of a grating with varying pitch and varying height.

FIG. 12 depicts an embodiment of a cross section of a second grating 1200. The second grating 1200 is formed in the substrate 715 after developing the photoresist and etching the substrate 715. The second grating 1200 is similar to the first grating 1100, except the second grating 1200 has varying thickness t (e.g., varying as a function of x and/or y) in addition to varying pitch. Thickness t is measured in the z-direction (e.g., from a back surface 1205 of the substrate 715). The first ridge 1105-1 is defined by a first thickness t1, the second ridge 1105-2 is defined by a second thickness t2, the third ridge 1105-3 is defined by a third thickness t3, and the fourth ridge 1105-4 is defined by a fourth thickness t4, wherein t1>t2>t3>t4. In some embodiments, depths of grooves 1110 are changed as a function of x and/or y in addition to, or in lieu of, changes to thickness t of ridges 1105. In some embodiments, a characteristic of the beam of electrons is a duty cycle of the beam of electrons. A duty cycle of the beam of electrons is timing of when the beam of electrons is on and off. In some embodiments, duty cycle of the beam of electrons is varied as a monotonic function because off times of the beam of electrons are changed (e.g., increased) as the platform 710 is moved (e.g., at constant speed in a negative y direction).

Figure 13:
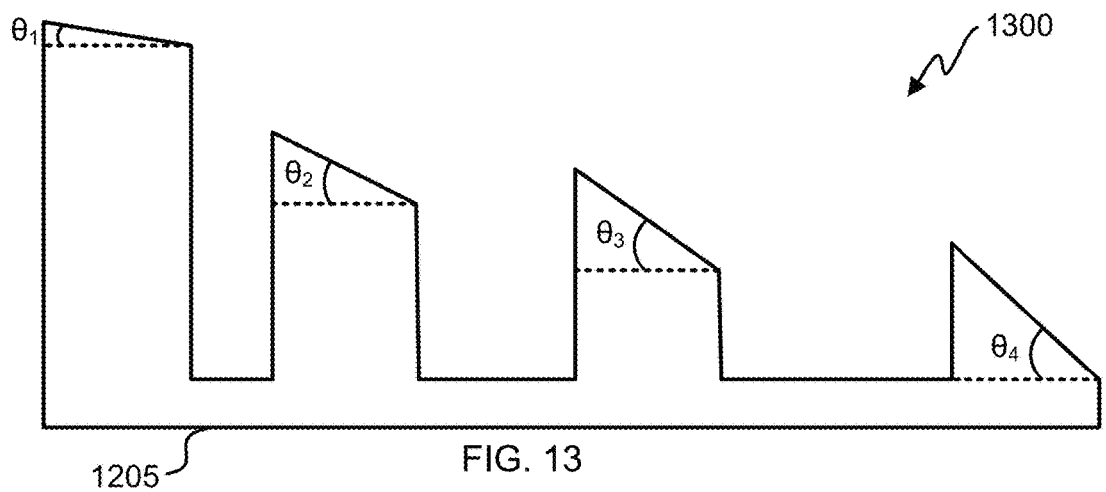
FIG. 13 depicts an embodiment of a cross section of a grating with varying pitch, varying height, and varying blaze.

FIG. 13 depicts an embodiment of a cross section of a third grating 1300 with varying pitch, varying height, and varying blaze angle. The third grating 1300 is formed in the substrate 715 after developing the photoresist and etching the substrate 715. FIG. 13 is similar to FIG. 12, except ridges 1105 have varying blaze angle θ in addition to varying pitch and varying thickness. Blaze angle θ is measured from a line parallel to the back surface 1205 of the substrate 715 and to a surface of the ridge 1105. The first ridge 1105-1 is defined by a first blaze angle θ1, the second ridge 1105-2 is defined by a second blaze angle θ2, the third ridge 1105-3 is defined by a third blaze angle θ3, and the fourth ridge 1105-4 is defined by a fourth blaze angle θ4, wherein θ1<θ2<θ3<θ4.

Figure 14:
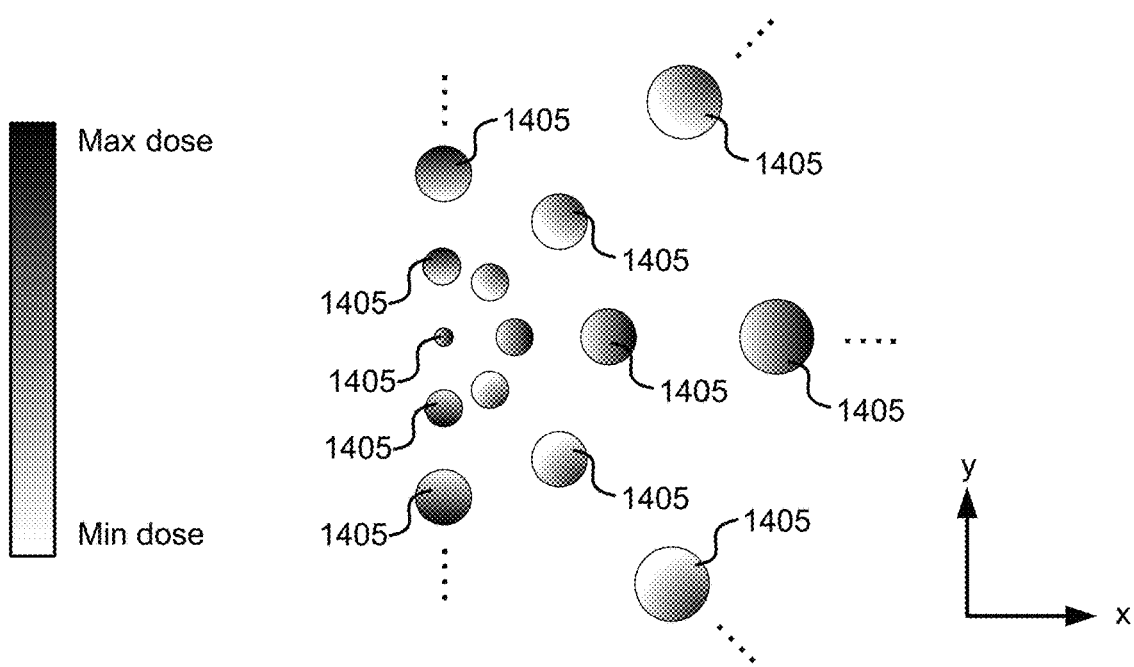
FIG. 14 depicts another embodiment of a map of a dose for exposure of a photoresist to define an array of elements on a substrate.

FIG. 14 depicts another embodiment of a map of a dose for exposure to define an array of elements on a substrate. FIG. 14 depicts an array of elements 1405. The elements 1405 are circles with varying diameters as a function of x and y. The circles have varying pitch (distance between holes). The circles have varying height (e.g., thickness and/or blaze angle) and/or blaze direction as a function of x and y. The array of elements 1405 in FIG. 14 is based on an elliptical (e.g., circle) pattern, whereas the array 1005 of FIG. 10 is based on a rectangular pattern.

Figure 15:
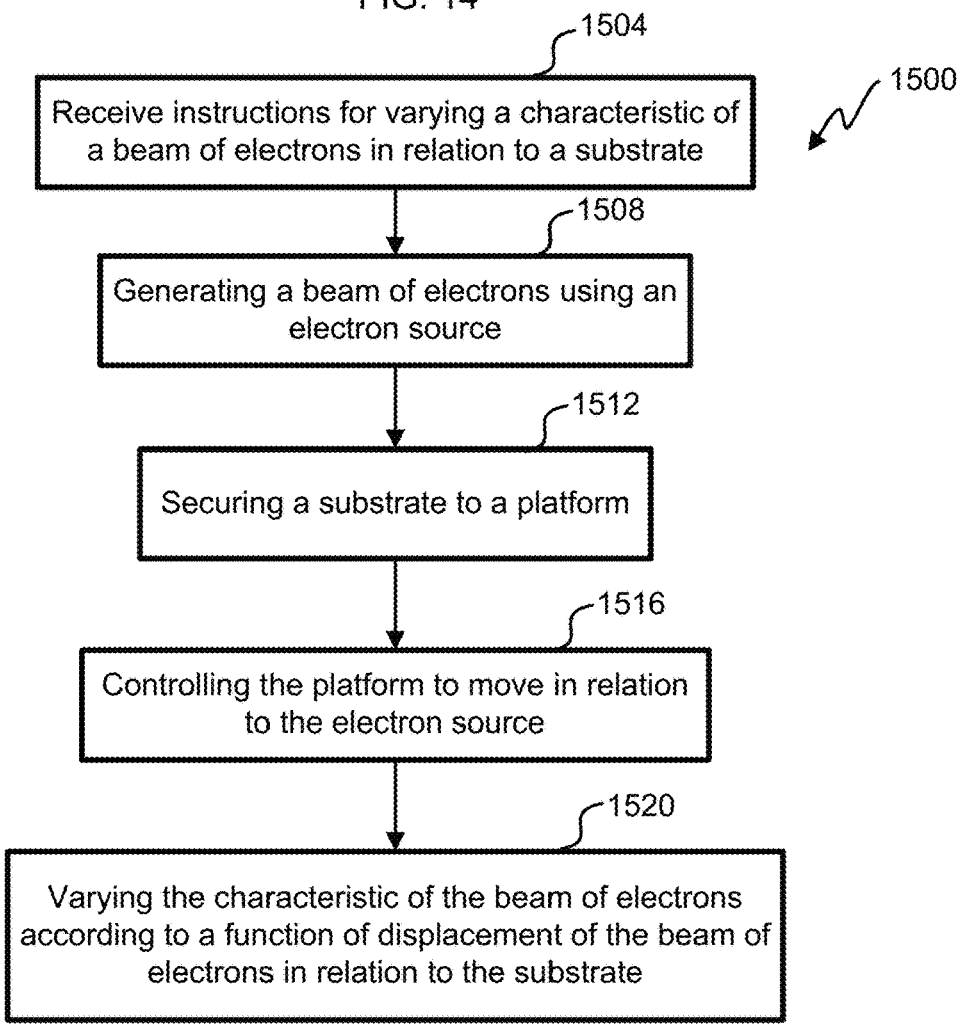
FIG. 15 illustrates an embodiment of a flowchart of a process for a method of fabricating an optical device using electron-beam lithography.

FIG. 15 illustrates an embodiment of a flowchart of a process 1500 for a method of fabricating an optical device using e-beam lithography. Process 1500 begins in step 1504 with receiving instructions for varying a characteristic of the beam of electrons 725 as a function of displacement of the substrate 715 in relation to the beam of electrons 725. In some embodiments, the operator enters the function into an MBMS device. In some embodiments, the instructions comprise a map of dose for exposure. In some embodiments, the map of dose is a gray-scale image. Is some embodiments an operator inputs a two-dimensional function. An example of instructions for varying a characteristic of the beam of electrons 725 as a function of beam displacement of the substrate in relation to the beam of electrons 725 is providing instructions for moving a stage in one, two, and/or three dimensions, since moving a stage with a substrate secured to the stage will move the substrate in relation the beam of electrons 725. Example two-dimensional functions that vary linewidth and pitch are:

Linewidth$(x,y)=25+50*x^2/900+100*\sin(pi*x/30)$;

Pitch$(x,y)=350+50*y*x/900$; and $[x,y]$=mm; [linewidth, pitch]=nm; $0<x, y<30$ mm.

The instructions are converted into code for the controller 720 to manipulate the electron source 705 and the platform 710. The controller 720 manipulates the electron source 705 by providing commands to the electron source 705 to turn on, turn off, generate more or less electrons per unit time, and/or to move the beam of electrons 725 in relation to the substrate 715.

In step 1508, a beam of electrons 725 is generated. The electron source 705 generates the beam of electrons 725. In some embodiments, the electron source is an electron gun. In step 1512 a substrate 715 is secured to the platform 710. In some embodiments, the substrate 715 is a silicon substrate. The substrate 715 is secured to the platform 710 such that the substrate 715 does not move relative to the platform 710 while the substrate 715 is secured to the platform 710. Controlling the platform to move in relation to the electron source occurs in step 1516. In step 1520, the characteristic of the beam of electrons 725 is varied according to the function of displacement of the beam of electrons 725 in relation to the substrate 715. In some embodiments, the platform 710 is moved in the x-dimension and/or the y-dimension relative to a point where electrons make contact with the substrate 715; a normal vector of an interface between the platform 710 and the substrate 715 is parallel to the z-dimension.

In some embodiments, the characteristic of the beam of electrons 725 comprises start times and stop times of the beam of electrons 725. For example, while making a grating with variable pitch, the electron source 705 turns on at t1, t3, and t5; and the electron source 705 turns off at t2, t3, t4; wherein t2 is after t1, t3 is after t2, t4 is after t3, and t5 is after t4. As the platform 710 is moved at constant speed, t5 minus t3 is greater than t3 minus t1. In some embodiments, the characteristic of the beam of electrons 725 comprises a dwell time of the beam of electrons 725. For example, the platform 710 could speed up and/or slow down and/or the electron source can direct the beam of electrons to provide a lighter or heavier dose.

In some embodiments, the characteristic of the beam of electrons 725 comprises a width of the beam of electrons 725; displacement movement of the platform in relation to the electron source is along only one axis of a three-dimensional coordinate system; movement of the platform in relation to the electron source is along two dimensions of a three-dimensional coordinate system; the characteristic of the beam of electrons is a sequence of start times and stop times of the beam of electrons, and the sequence speeds up or slows down in relation to movement of the platform; interval durations between start times and/or stop times of the sequence change while the platform maintains constant velocity; the start times and/or stop times of the sequence have consistent intervals while the platform changes velocity; the platform is moved in a first direction, the electron source moves the beam of electrons in a second direction, and/or the characteristic of the beam of electrons is start times and/or stop times of the beam of electrons; and/or the function modifies the beam of electrons to expose one or more portions of a photoresist on the substrate, and the method further includes etching the substrate and the photoresist to form one or more elements in the substrate based on the one or more portions of the photoresist that are exposed.

In some embodiments, the one or more elements include a gray-tone element repeated in two-dimensions; the one or more elements include circles with varying diameters; the one or more elements include a circle and a polygon; the one or more elements include grating ridges of varying heights; the one or more elements include elements with varying heights; the optical device is a grating; the grating is a chirped grating; the function is used to modify a pitch of a grating over a writing area; the function is used to modify dose over a writing area; and/or the function is used to modify a linewidth of a grating over the writing area.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method of fabricating an optical device using electron-beam lithography, the method comprising:
   receiving instructions for varying a characteristic of a beam of electrons as a function of displacement of a substrate in relation to the beam of electrons, wherein the function is a monotonic function;
   generating the beam of electrons using an electron source;
   securing the substrate to a platform;
   controlling the platform to move in relation to the electron source;
   varying the characteristic of the beam of electrons according to the function of displacement of the substrate in relation to the beam of electrons, wherein:
      the optical device is configured to couple light out of a waveguide of an artificial-reality display; and
      varying the beam of electrons comprises modifying the beam of electrons to expose one or more portions of a photoresist on the substrate; and
   etching the substrate and/or the photoresist to form one or more elements in the substrate based on the one or more portions of the photoresist that are exposed, wherein the one or more elements include an element with varying height repeated in two dimensions.

2. The method of claim 1, further comprising executing the instructions multiple times to expose a photoresist on the substrate to define an array of elements in the photoresist.

3. The method of claim 1, wherein the characteristic of the beam of electrons comprises a dwell time of the beam of electrons, which changes a dose of electrons exposing a photoresist on the substrate.

4. The method of claim 1, wherein:
the characteristic of the beam of electrons is a sequence of start times and stop times of the beam of electrons in relation to movement of the platform.

5. The method of claim 4, wherein durations of intervals between start times and/or stop times of the sequence change while the platform maintains constant velocity.

6. The method of claim 4, wherein the start times and/or stop times of the sequence have consistent intervals while the platform changes velocity.

7. The method of claim 1, wherein the one or more elements include circles with varying diameters and varying blaze direction.

8. The method of claim 1, wherein the one or more elements include grating ridges of varying heights and varying blaze angle.

9. The method of claim 1, wherein:
the optical device is a grating, and
the grating is a chirped grating.

10. The method of claim 1, wherein the characteristic of the beam of electrons is an intensity of the beam of electrons.

11. The method of claim 1, wherein:
a writing field of the beam of electrons on the platform is defined by an area of the platform that can be exposed by the beam of electrons without field stitching, and
the writing field is equal to or greater than 0.36 square millimeters and equal to or less than 3600 square millimeters.

12. The method of claim 1, wherein the characteristic of the beam of electrons is a width of the beam of electrons.

13. A system used in electron-beam lithography for fabricating an optical device, the system comprising:
an electron source, wherein the electron source produces a beam of electrons;
a platform configured to:
hold a substrate, and
move in relation to the electron source; and
a controller configured to:
control movement of the platform in relation to the electron source, and
vary a characteristic of the beam of electrons as a function of substrate displacement in relation to the beam of electrons, wherein:
the function is a monotonic function,
the optical device is configured to couple light out of a waveguide of an artificial-reality display, and
varying the beam of electrons is configured to expose one or more portions of a photoresist on the substrate so that one or more elements can be formed in the substrate based on the one or more portions of the photoresist that are exposed, and
the one or more elements include an element with varying height repeated in two dimensions.

14. The system as recited in claim 13, further comprising a photoresist covering at least a portion of a surface of the substrate, wherein the beam of electrons forms a feature in the photoresist by exposing the photoresist.

15. The system as recited in claim 13, wherein:
a writing field of the beam of electrons on the platform is defined by an area of the platform that can be exposed by the beam of electrons without field stitching, and
the writing field is equal to or greater than 0.36 square millimeters and equal to or less than 3600 square millimeters.

16. The system as recited in claim 13, wherein movement of the platform in relation to the electron source is along only one axis of a three-dimensional coordinate system.

17. The system as recited in claim 13, wherein movement of the platform in relation to the electron source is along two dimensions of a three-dimensional coordinate system.

18. The system as recited in claim 13, wherein the characteristic of the beam of electrons comprises a width of the beam of electrons.

19. The system as recited in claim 13, wherein:
the platform is configured to move in a first direction,
the electron source is configured to move the beam of electrons in a second direction, and
the characteristic of the beam of electrons is varied start times and/or stop times of the beam of electrons.

20. The system of claim 13, wherein the one or more elements includes circles with varying blaze directions.

* * * * *